(12) United States Patent
Dhanasekaran et al.

(10) Patent No.: US 6,653,711 B1
(45) Date of Patent: Nov. 25, 2003

(54) REDUCING FUSE PROGRAMMING TIME FOR NON-VOLATILE STORAGE OF DATA

(75) Inventors: Vijayakumar Dhanasekaran, Chennai (IN); Raghu Nandan Srinivasa, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 10/170,428

(22) Filed: Jun. 14, 2002

(51) Int. Cl.$^7$ ............................................... H01L 29/00
(52) U.S. Cl. ........................ 257/529; 265/97; 265/225.7
(58) Field of Search ............................ 257/529; 365/97, 365/225.7

(56) References Cited

U.S. PATENT DOCUMENTS 6,141,281 A * 10/2000 Mobley et al. .......... 365/225.7
6,438,059 B2 * 8/2002 Akita et al. .............. 365/225.7
6,574,157 B2 * 6/2003 Chou ......................... 365/200

* cited by examiner

*Primary Examiner*—Ngân V. Ngô
(74) *Attorney, Agent, or Firm*—W. James Brady, III; Frederick J. Telecky, Jr.

(57) ABSTRACT

Multiple fuse circuits are used associated with a corresponding number of bits forming a desired value which may need to be stored in a non-volatile storage. Assuming the desired value contains a first count number of zeros and a second count number of ones, the fuse circuits at bit positions having values equaling the logical value with smaller count are blown. If the blown fuse circuits generate the logical value associated with larger one of the two counts, the outputs of all the fuse circuits are inverted. Thus, a desired value can be always generated while reducing the number of fuse circuits blown.

9 Claims, 2 Drawing Sheets

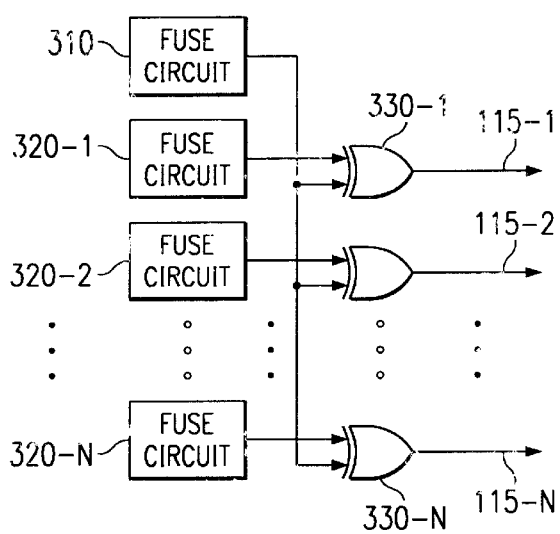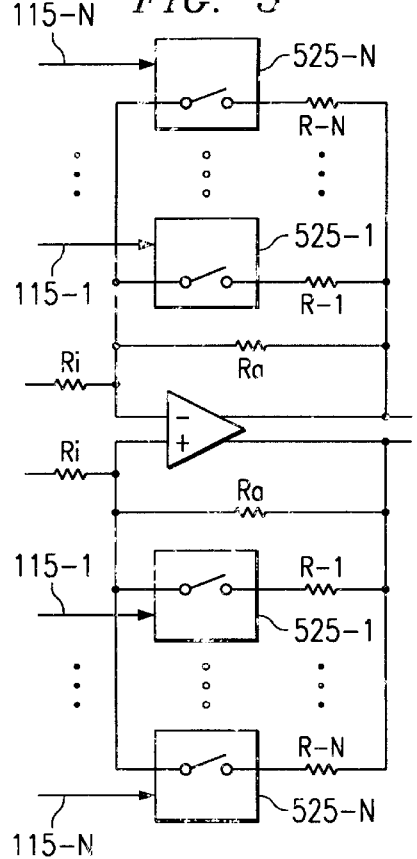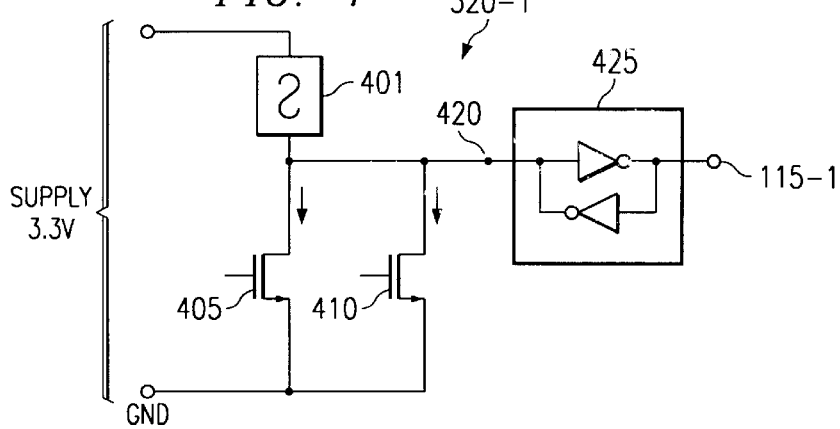

REDUCING FUSE PROGRAMMING TIME FOR NON-VOLATILE STORAGE OF DATA

BACKGROUND OF THE INVENTION

1. Field of the Invention

The present invention relates to integrated circuits, and more specifically to a method and apparatus for reducing fuse programming time for non-volatile storage of data in an integrated circuit.

2. Related Art

Integrated circuits often store data ("non-volatile data") in a non-volatile manner. Data stored in non-volatile manner generally continues existence on an integrated circuit even when the integrated circuit (storing the data) is powered off and turned on again.

One problem often encountered with such storage in integrated circuits is that the data value may not be known prior to completion of manufacturing of an integrated circuit. For example, in an approach often known as trimming, a desired impedance value is attained by using multiple parallel impedances, and turning on/off only some of the impedances. Trimming may be necessary, for example, because attaining precise desired impedance value is often not practicable due to process variations or imprecision of manufacturing technologies.

Turning on/off of each impedance may be controlled by a bit, and the bits together form non-volatile data. The specific impedances to turn on/off are generally known only after measurements are made on the manufactured integrated circuits. Accordingly, a desired value for the non-volatile data (which controls the specific impedances turned on or off) to be stored may be known only after completion of manufacturing.

One approach often used in such situations is to use a fuse circuit associated with (or to generate) each bit (non-volatile bit). In general, a fuse circuit generates one logical value if blown-off, and the other logical value otherwise. The output values generated by many such fuses form the desired non-volatile data. The blowing-off of fuses may be referred to as fuse programming.

Thus, in the above trimming example, the fuse circuits corresponding to bits providing one logical value may be blown off. Accordingly, the specific impedances turned on/off many be controlled after manufacturing of integrated circuits is complete by appropriate fuse programming.

In general, it is desirable to reduce the amount of time required for fuse programming, for example, to reduce the cost associated with blowing fuse circuits.

SUMMARY OF THE INVENTION

The present invention reduces the amount of time required for fuse programming when implementing a non-volatile data storage. In an embodiment, fuse circuits generating corresponding outputs are provided. Each fuse circuit is associated with a corresponding bit position of a desired value. A first count and a second count respectively representing the number of logical ones and zeros in the desired value are generated.

According to an aspect of the present invention, a set of fuse circuits at bit positions equaling the logical value with a smaller one of the two counts are blown. The outputs of the fuse circuits are inverted if the blown set of fuse circuits are designed to generate the logical value associated with the larger one of the two counts after being blown.

As a result, no more than half of the fuse circuits may need to be blown for any desired value to be implemented in a non-volatile data storage.

In an embodiment, the inversion of the outputs of fuse circuits is implemented using another fuse and XOR gates. Each XOR gate accepts one of the fuse circuit outputs and the output of the another fuse circuit (XOR fuse circuit). The XOR fuse circuit is implemented to generate a 1 if the blown fuses are designed to generate a logical value associated with the larger one of the two counts. As a result, each XOR gate inverts the corresponding fuse circuit output.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 3 is a circuit diagram illustrating the details of a non-volatile storage in an embodiment of the present invention;

FIG. 4 is a circuit diagram illustrating the details of an embodiment of a fuse circuit; and FIG. 5 is a circuit diagram of an amplifier illustrating an example use of the approach of the present invention.

DETAILED DESCRIPTION OF THE PREFERRED EMBODIMENTS

1. Overview and Discussion of the Invention

An aspect of the present invention reduces the amount of time required to program (store) non-volatile data in integrated circuits. An embodiment according to the present invention may contain a fuse circuit associated with each bit of the non-volatile data to be stored. The embodiment may then determine a first count and a second count respectively representing the number of logical zeros and ones contained in the data to be stored. Only the fuse circuits corresponding to the logical value (0 or 1) having the smaller count are blown off. The outputs of all the fuse circuits are inverted if needed to obtain the desired non-volatile data.

Due to such an approach, the number of fuse circuits to be blown may not exceed half the aggregate number of fuse circuits generating the non-volatile data. As a result, the time required to perform fuse programming and the associated costs for testing integrated circuits may be minimized.

Several aspects of the invention are described below with reference to example devices for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Integrated Circuit

Figure 1:
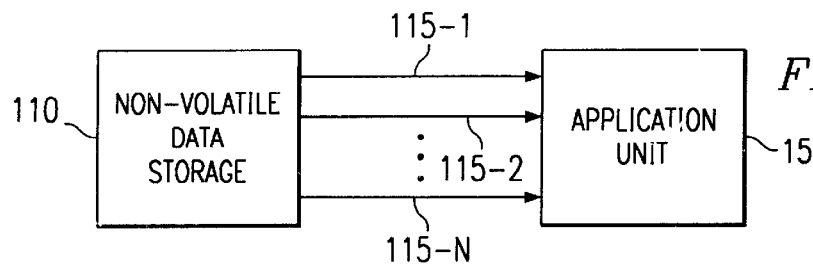
FIG. 1 is a block diagram illustrating the details of an integrated circuit in an embodiment of the present invention.

FIG. 1 is a block diagram illustrating the details of an integrated circuit that stores non-volatile data. Integrated circuit 100 is shown containing non-volatile data storage 110 and application block 150. Each block is described in further detail below.

Application block 150 is shown receiving N-bits of data on paths 115-1 through 115-N respectively. Application block 150 may perform any operation(s) as desired by a designer. Application block 150 may use the provided N-bit value in various ways. For example, the N-bit value may be represented as a version number of integrated circuit 100 which is read by user applications using application block 150. An embodiment in which the N-bit value is used to trim various impedances in application block 150 is described below for illustration.

Non-volatile data storage 110 implemented according to an aspect of the present invention stores the data in a non-volatile manner and provides the stored data bits on paths 115-1 through 115-N. The manner in which non-volatile data storage 110 may be implemented to provide desired bits (value) on paths 115-1 through 115-N is described below in further detail with reference to several examples.

3. Method

Figure 2:
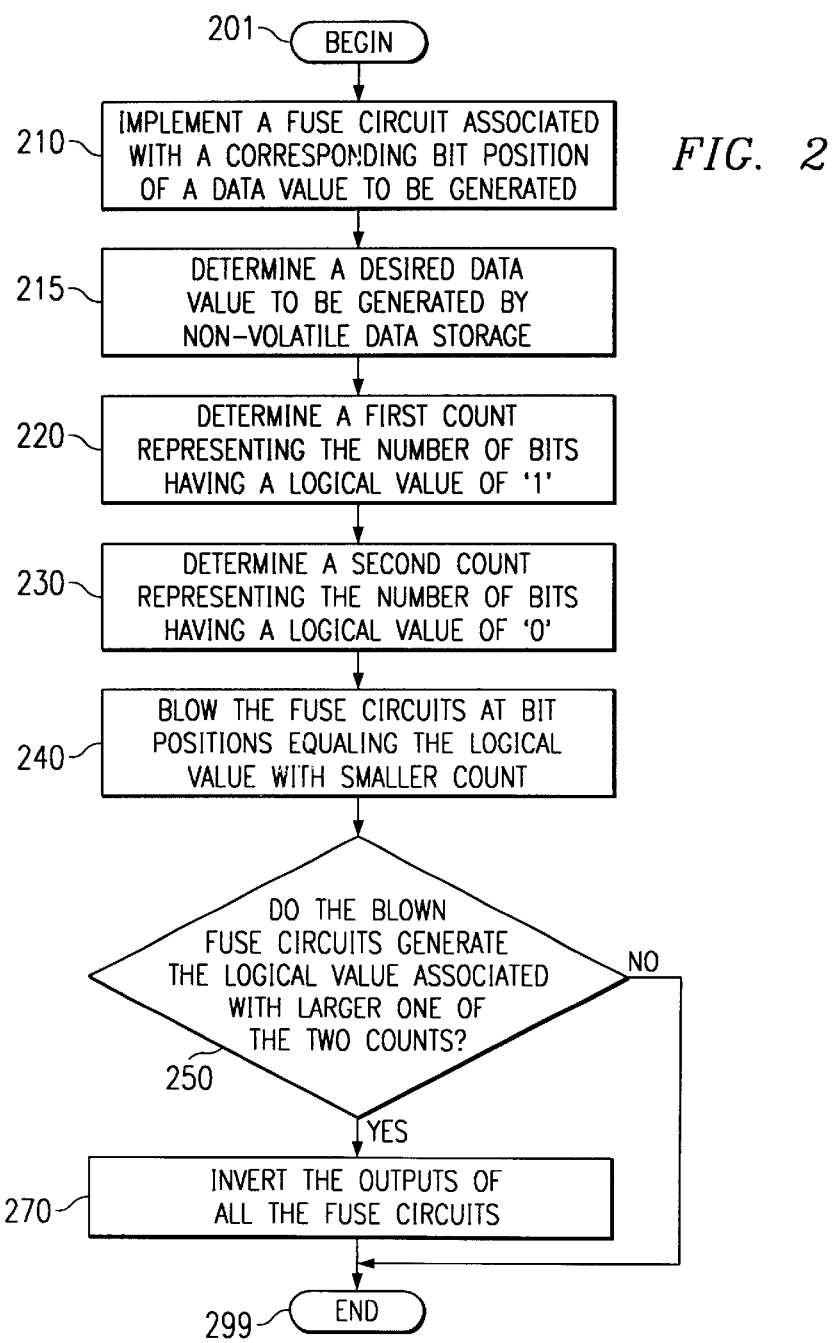
FIG. 2 is a flow chart illustrating a method by which fuse programming time may be reduced in implementing a non-volatile storage which stores a desired data value according to an aspect of the present invention.

FIG. 2 is a flow-chart illustrating a method by which a non-volatile data storage can be implemented according to an aspect of the present invention. The method is described with reference to FIG. 1 for illustration. However, the method can be implemented in several other embodiments as will be apparent to one skilled in the relevant arts based on the disclosure provided herein. The method begins in step 201 in which control passes to step 210.

In step 210, a fuse circuit is implemented associated with a corresponding bit position of a data value to be generated. As described below, each fuse circuit may be made to eventually provide a desired bit value at the corresponding bit position while minimizing the aggregate time required for fuse programming ("blowing off some of the fuse circuits") of integrated circuit 100.

In step 215, the desired data value to be generated by non-volatile data storage 110 is determined. The data value is generally determined according various requirements for which integrated circuit 100 is designed. The manner in which the data value can be determined is described with an example in a section below.

In step 220, a determination of a first count representing the number of bits having a value of 1, and in step 230 a determination of a second count representing the number of bits having a value of 0 are determined. The two determinations may be performed by counting the number of ones and zeros.

In step 240, the fuse circuits at bit positions equaling the logical value with less count are blown. In step 250, a determination is made as to whether the blown fuse circuits would generate the logical value associated with the larger count. As may be readily appreciated, all the fuse circuits together in such a situation would generate a ones complement of the desired value.

Accordingly control passes to step 270, where are all output bits are inverted to generate the desired value, and control passes to step 299. If the blown fuse circuits are designed to generate the logical value associated with the smaller count, the output of the fuse circuits represents the desired value, and control passes to step 299. The method ends in step 299.

From the above, it may be appreciated that utmost half the number of fuses may need to be blown among the fuse circuits implemented associated with the respective bit positions of the desired value. Additional circuitry may be needed for the steps 250 and 270. An example implementation of the method of FIG. 2 is described below.

4. Non-volatile Storage

FIG. 3 is a circuit diagram illustrating the details of a non-volatile data storage in an embodiment of the present invention. Non-volatile data storage 110 is shown containing fuse circuits 310 and 320-1 through 320-N, and XOR gates 330-1 through 330-N. Each component is described below in detail.

Fuse circuits 320-1 through 320-N are respectively associated with a corresponding one of the N-bit data value sought to be generated using non-volatile data storage 110. Each fuse circuit generates one logical value when blown and the other value otherwise. The operation and implementation of an example fuse circuit is described below.

Fuse circuit 310 and XOR gates 330-1 through 330-N together (an example of an inverting circuit) invert the output values of fuse circuits 320-1 through 320-N if necessary only. As described above with reference to steps 250 and 270 of FIG. 2, the fuse circuits associated with bit positions equaling the logical value with lower count are always blown, and may need to be inverted to generate the desired value. Such an objective may be achieved as described below.

Fuse circuit 310 is blown or left without blowing to cause a one to be generated when the outputs of fuse circuit 320-1 through 320-N need to be inverted, and a zero otherwise. XOR gates 330-1 through 330-N respectively invert the output values generated by fuse circuits 320-1 through 320-N when fuse circuit 310 generates a one and passes through the output values of fuse circuits 320-1 through 320-N unaltered otherwise. Other circuits such as XNOR gates may also be used to perform inversion.

Thus, in operation, the specific fuse circuits (of 320-1 through 320-N) to be blown are determined based on a desired value sought to be generated from (or stored in) non-volatile data storage 110. A decision on blowing fuse circuit 310 is also made depending on whether the output values of fuse circuits 320-1 through 320-N are to be inverted or not. Accordingly, non-volatile data storage 110 may be implemented while reducing the fuse programming time. The description is continued with respect to an example implementation of a fuse circuit.

5. Fuse Circuit

FIG. 4 is a circuit diagram illustrating the details of an embodiment of a fuse circuit. The fuse circuit is described as corresponding to fuse circuit 320-1 for illustration. However, the remaining fuse circuits (310 and 320-2 through 320-N) of FIG. 3 may also be implemented similarly. Fuse circuit 320-1 shown contains fuse element 401, NMOS transistors 405 and 410, inverting latch 425 and supply voltage of 3.3 v. Each component is described below.

Fuse element 401 is made of material such as thin filament of poly silicon, which burns when high current passes through the filament. Burning fuse element 401 causes fuse circuit 320-1 to be considered blown. Fuse element 401 may be implemented using one of many known ways.

When burnt, fuse element 401 operates as a high impedance and thus causes a logical value of zero to be provided as an input to inverting latch 425. If not burnt, fuse element 401 operates as a low impedance and causes a logical value of one to be applied as input to the latch.

NMOS transistor 405 is used to burn fuse element according to the desired data value. Applying high voltage to the gate terminal of transistor 405 causes fuse element 401 to burn as would be apparent to one skilled in the relevant arts. NMOS transistor 410 is used to sense whether fuse element 401 is in a blown state or un-blown state. Due to the operation of NMOS transistor 410, a high voltage (logical 1) is provided on path 420 when fuse element 401 is un-blown, and a low voltage level otherwise.

Inverting latch 425 latches the logical value represented by voltage at node 420, and provides an inverted output on path 115-1. Inverting latch 425 can be implemented in a known way.

Thus in operation, when fuse circuit 401 is burnt, a voltage level of zero volts (representing zero logical value) is presented at node 420. Inverting latch 425 inverts the zero logical value to cause a logical one to be generated on path 115-1. Similarly, a logical zero is generated when fuse circuit 401 is not burnt. Accordingly, fuse circuit 320-1 generates logical one when burnt and zero otherwise. However, fuse circuits which generate 0 and 1 when burnt can be used in alternative embodiments.

6. Example Application

FIG. 5 is a circuit diagram of an amplifier illustrating an example application of the approach of the present invention. Differential amplifier 500 is shown containing operational amplifier 510, resistors Ri, Ra and R-1 through R-N, and switches 525-1 through 525-N. As the resistance values are symmetric on both sides of operational amplifier 510, the resistors in similar positions on both sides are shown with the same labels R-1 through R-N. Each component is described in further detail below.

Operation amplifier 510 amplifies an input signal according to a ratio of effective impedance at input (Zi) to across (Za). Assuming hypothetically that only Ri and Ra resistors are present/operational, Zi=Ri and Za=Ra. One problem in attaining a desired gain (within acceptable tolerance limits) is that it is often difficult to attain precise impedance values. Accordingly, a technique known as trimming is employed to attain a desired impedance for Za as described below.

Multiple resistors R-1 to R-N are provided in parallel to resistor Ra. Switches 525-1 through 525-N respectively control whether a corresponding resistor R-1 through R-N is connected in parallel to Ra. Only the resistors as necessary to attain a desired impedance value (Za), are activated by turning on the corresponding switch.

Thus, by appropriate testing and measurement, the set (zero or more) of resistors to be connected in parallel to resistor Ra are determined. One logical value will need to be provided as input to the switches controlling the operation the resistors to be connected, and the other logical value otherwise. The logical values at the respective bit positions determines the desired value to be generated by non-volatile data storage 110. The fuse elements to be burnt are determined as described above, which causes the corresponding fuse circuit to be blown. The data generated by non-volatile data storage 110 causes the desired impedance value to be attained for Za.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of creating a non-volatile storage storing a desired data value, said desired data value containing a plurality of bit values at a corresponding plurality of bit positions, said desired data value containing a first count number of a first logical value and a second count number of second logical value, said method comprising:

provide a plurality of fuse circuits generating a corresponding plurality of outputs, wherein each of said plurality of fuse circuits is associated with a corresponding one of said plurality of bit positions;

blowing a set of fuse circuits at bit positions having values equaling the logical value with a smaller value of said first count number and said second count number, wherein said set of fuse circuits are contained in said plurality of fuse circuits; and inverting all of said outputs if said set of fuse circuits are designed to generate the logical value with a larger value of said first count number and said second count number after being blown.

2. The method of claim 1, wherein said inverting is performed using another fuse circuit and a plurality of XOR gates.

3. A non-volatile storage storing a desired data value, said desired data value containing a plurality of bit values at a corresponding plurality of bit positions, said desired data value containing a first count number of a first logical value and a second count number of second logical value, said non-volatile storage comprising:

fuse circuit means for generating a corresponding plurality of outputs, wherein each of said plurality of fuse circuits is associated with a corresponding one of said plurality of bit positions;

means for blowing a set of fuse circuits at bit positions having values equaling the logical value with a smaller value of said first count number and said second count number, wherein said set of fuse circuits are contained in said plurality of fuse circuits; and means for inverting all of as said outputs if said set of fuse circuits are designed to generate the logical value with a larger value of said first count number and said second count number after being blown.

4. The non-volatile storage of claim 2 wherein said means for inverting comprises an XOR gate or an XNOR gate receiving a corresponding one of said plurality of outputs as an input.

5. An integrated circuit comprising:

an application block receiving a desired data value, said desired data value containing a plurality of bit values at a corresponding plurality of bit positions, said desired data value containing a first count number of a first logical value and a second count number of second logical value;

a non-volatile storage providing said desired data value, said non-volatile storage comprising:

a plurality of fuse circuits generating a corresponding plurality of outputs, wherein each of said plurality of fuse circuits is associated with a corresponding one of said plurality of bit positions; and an inverting circuit to invert said plurality of outputs upon receiving one value of a input signal and passing through said plurality of outputs upon receiving another value of said input signal after being blown.

6. The integrated circuit of claim 5, wherein a set of fuse circuits are blown, wherein said set of fuse circuits are comprised in said plurality of fuse circuits, said set of fuse circuits corresponding to bit positions having values equaling the logical value with a smaller value of said first count number and said second count number, and wherein said input signal generates said one value if said set of fuse circuits are designed to generate the logical value with a larger value of said first count number and said second count number.

7. The integrated circuit of claim 6, wherein said inversion circuit comprises:

another fuse circuit which generates said input signal; and a plurality of XOR gates receiving said input signal and a corresponding one of said plurality of outputs.

8. The integrated circuit of claim 6, wherein said non-volatile storage stores a version number of said integrated circuit.

9. The integrated circuit of claim 6, wherein said application block comprises a plurality impedances to be trimmed, each of said plurality of bit values controlling whether a corresponding one of said plurality of impedances is to be trimmed.

* * * * *